United States Patent [19] [11] 4,080,486
Walker et al. [45] Mar. 21, 1978

[54] COATING SYSTEM FOR SUPERALLOYS

[75] Inventors: James L. Walker; John R. Ross, both of Schenectady, N.Y.

[73] Assignee: General Electric Company, Schenectady, N.Y.

[21] Appl. No.: 508,747

[22] Filed: Sep. 24, 1974

Related U.S. Application Data

[62] Division of Ser. No. 346,919, Apr. 2, 1973, Pat. No. 3,873,347.

[51] Int. Cl.² .............................................. B32B 15/20
[52] U.S. Cl. .................................. 428/653; 428/652; 428/678; 428/926
[58] Field of Search ................. 29/194; 428/651, 652, 428/653, 654, 678, 926

[56] References Cited

U.S. PATENT DOCUMENTS

| | | | |
|---|---|---|---|
| 3,649,225 | 3/1972 | Simmons | 29/194 |
| 3,676,085 | 7/1972 | Evans et al. | 29/194 |
| 3,741,791 | 6/1973 | Maxwell et al. | 29/194 X |
| 3,754,903 | 8/1973 | Goward et al. | 29/194 X |
| 3,869,779 | 3/1975 | Gedwill et al. | 29/194 |

*Primary Examiner*—Arthur J. Steiner
*Attorney, Agent, or Firm*—F. Wesley Turner; Joseph T. Cohen; Jerome C. Squillaro

[57] ABSTRACT

A protective coating system is provided for nickel-base and cobalt-base superalloys which is capable of imparting oxidation and corrosion resistance at elevated temperatures. The superalloy body is first coated by physical vapor deposition with a composition consisting essentially of chromium, aluminum, a member selected from the group consisting of yttrium and the rare earth elements, and at least one element selected from the group consisting of iron, cobalt and nickel, and thereafter the body is subjected to an aluminizing overcoating to increase the corrosion resistance.

4 Claims, 5 Drawing Figures

COATING SYSTEM FOR SUPERALLOYS

This is a division of application Ser. No. 346,919 filed Apr. 2, 1973 now U.S. Pat. No. 3,873,347.

The superalloys are heat-resistant materials having superior strengths at high temperatures. Many of these alloys contain iron, nickel or cobalt alone or in combination as the principal alloying elements together with chromium to impart surface stability and usually contain one or more minor constituents, such as molybdenum, tungsten, columbium, titanium and aluminum for the purpose of effecting strengthening. The physical properties of the superalloys make them particularly useful in the manufacture of gas turbine engine components.

Heretofore, surface coatings have been used to protect the superalloy articles from high temperature oxidation and corrosion. Various coatings for superalloys have been described in the literature and of particular interest are coating compositions consisting essentially of chromium, aluminum, a member selected from the group consisting of yttrium and the rare earth elements and a metal selected from the group consisting of iron, cobalt, and nickel. Illustrative coatings wherein the compositions are given in weight percent are designated as follows:

| Ingredients | FeCrAlY | CoCrAlY | NiCrAlY |
| --- | --- | --- | --- |
| Chromium | 25 – 29 % | 19 – 24 % | 20 – 35 % |
| Aluminum | 12 – 14 % | 13 – 17 % | 15 – 20 % |
| Yttrium | 0.6 – 0.9 % | 0.6 – 0.9 % | 0.05 – 0.30 % |
| Iron | balance | — | — |
| Cobalt | — | balance | — |
| Nickel | — | — | balance |

The application of the coating composition to a variety of substrates, such as nickel-base and cobalt-base superalloys may be achieved by physical vapor deposition in a vacuum chamber. During this procedure, the composition is thermally evaporated from a source heated, for example, by an electron beam, and a thin metal coating is condensed on the surface of the workpiece. Layers of the coating are formed as the workpiece is rotated until the thickness is in the range of about 3–5 mils. Unfortunately, the deposited coating has radially oriented defects which are the sites of attack by oxidizing and/or corrosive atmospheres at high temperatures. Such defects can lead to premature failure of the coating.

Attempts to prolong the useful life of superalloys coated with a FeCrAlY alloy are disclosed by Elam et al., U.S. Pat. 3,528,861. The coating effectiveness was found to be limited by the formation of an intergranular precipitate during the coating deposition cycle. The effect of the detrimental precipitate was improved by shot peening or glass bead blasting to break up the precipitate into small particles which are more easily taken into solution by heat treatment.

In accordance with the present invention, we have invented a method of improving the high temperature corrosion resistance of a nickel-base or cobalt-base superalloy body by first coating the superalloy body by physical vapor deposition with a composition consisting essentially of chromium, aluminum, a member selected from the group consisting of yttrium and the rare earth elements, and at least one element selected from the group consisting of iron, cobalt and nickel and thereafter aluminizing the coated body by chemical vapor deposition to increase the corrosion resistance of the body. The effectiveness of the coating system may be explained by the fact that the first coating exhibits grain boundaries that are oriented in a perpendicular direction to the deposition plane. Upon exposure to a corrosive environment, these boundaries are preferentially attacked resulting in ultimate failure of the coating. The application of an aluminizing overcoat prevents this type of failure and thereby substantially increases the life of the coated article. In addition, the concentration profile of our novel coating system indicates the presence of a high concentration of aluminum on the outer surface of the coating which may also contribute to the improved properties. The coated superalloy bodies prepared by our invention are particularly useful in making gas turbine engine components.

The invention is more clearly understood from the following description taken in conjunction with the accompanying drawing in which.

The superalloys are strong, high temperature materials which are particularly useful in gas turbine engines. A substantial listing of these materials is set forth by W. F. Simmons, *Compilation of Chemical Compositions and Rupture Strengths of Superalloys*, ASTM Data Series Publication No. DS9E, and may be represented by the nominal compositions in weight percent of the following superalloys:

| Ingredient | Rene 80 | Rene 100 | IN-738 | Udimet 500 |
| --- | --- | --- | --- | --- |
| C | 0.17 | 0.18 | 0.17 | 0.08 |
| Mn | 0.2 | 0.50 | 0.20 | 0.75 |
| Si | 0.2 | 0.50 | 0.30 | 0.75 |
| Cr | 14.0 | 9.5 | 16.0 | 19.0 |
| Ni | *Bal. | *Bal. | Bal. | Bal. |
| Co | 9.5 | 15.0 | 8.5 | 18.0 |
| Mo | 4.0 | 3.0 | 1.75 | 4.0 |
| W | 4.0 | — | 2.6 | — |
| Cb | — | — | 0.9 | — |
| Ti | 5.0 | 4.20 | 3.4 | 2.9 |
| Al | 3.0 | 5.50 | 3.4 | 2.9 |
| B | 0.015 | 0.015 | 0.01 | 0.005 |
| Zr | 0.03 | 0.06 | 0.10 | — |
| Fe | 0.2 | 1.0 max | 0.50 | 4.0 |
| Other | — | 1.0 V | 1.75 Ta | — |

The first coating of our protective coating system is designated herein as "MCrAlY" coating wherein M is a member selected from the group consisting of iron, cobalt, and nickel. This coating is broadly defined as consisting essentially in weight percent of the following nominal compositions:

| Ingredients | Weight % |
| --- | --- |
| Chromium | 14 – 35 |
| Aluminum | 4 – 20 |
| Yttrium | 0.1 – 3 |
| Iron  Cobalt  Nickel | Balance |

Figure 1:
FIG. 1 is a photomicrograph (500×) of a Rene 80 nickel-base superalloy body coated with a NiCrAlY coating.

Included in this formulation are the compositions designated hereinabove as FeCrAlY, CoCrAlY, and NiCrAlY. The MCrAlY coating is applied to the substrate by a physical vapor deposition technique which is described in considerable detail in *Vapor Deposition*, Edited by C. F. Powell et al., John Wiley & Sons, New York (1966). Accordingly, the coating is evaporated and deposited in a vacuum chamber. Typically, the metal alloy is heated by an electron beam focused on the metal alloy ingot to evaporate the metal to a vapor. During evaporation, the vapor condenses as a coating, preferably about 3–5 mils in thickness on the workpiece being coated. The material to be applied is heated in a high vacuum to a temperature at which its vapor pressure is about $10^{-2}$ torr or greater whereupon it emits molecular rays in all directions. During coating the vacuum must be very high to permit the molecular rays to travel from their source without disturbance until they hit the surface of the object to be coated. A photomicrograph of a nickel-base superalloy coated with a NiCrAlY coating is shown in FIG. 1.

Thereafter, the first coating is treated by an aluminizing overcoat by a chemical vapor deposition technique such as illustrated by Levine et al., U.S. Pat. No. 3,540,878, and as discussed in Powell et al. cited hereinabove. In a preferred embodiment, the aluminizing is performed by a pack-cementation method in which the article is packed in a porous mixture of refractory particles and granular aluminum or an aluminum containing alloy and heated to between 600°–1000° C. in the presence of a halide salt activator. In a specific embodiment as disclosed by Levine et al., the particulate pack mixture includes a powder of a multiphase ternary alloy of Ti, Al and C, an inert filler which will not react with the other components of the mixture to prevent powder sintering, and a halide salt activator such as member selected from the chlorides and fluorides of ammonia and the alkali metals. The most practical activator is a halide salt selected from NaF, KF, NH$_4$Cl and NH$_4$F in an amount of about 0.1–10 percent by weight of the mixture. The preferred filler material is refractory alumina powder which comprises about 10–98.5 weight percent of the total pack powder. During preparation of such a mixture, the filler powder, the powdered ternary alloy and the activator are blended together in a conventional mixing apparatus such as an ordinary powder blender. An illustrative pack contains about 4 percent by weight of the ternary alloy of Ti, Al and C.

Figure 2:
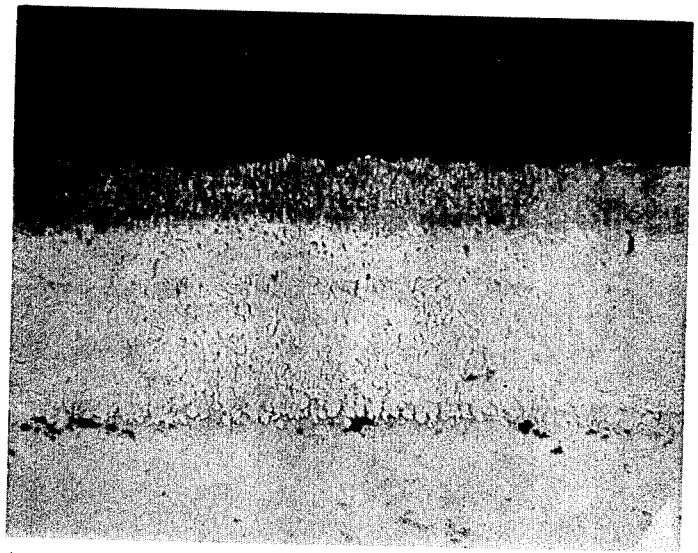
FIG. 2 is a photomicrograph (500×) of a Rene 80 nickel-base superalloy body coated with a first NiCrAlY coating and then treated with an aluminizing overcoat according to the method of our invention.
Figure 5:
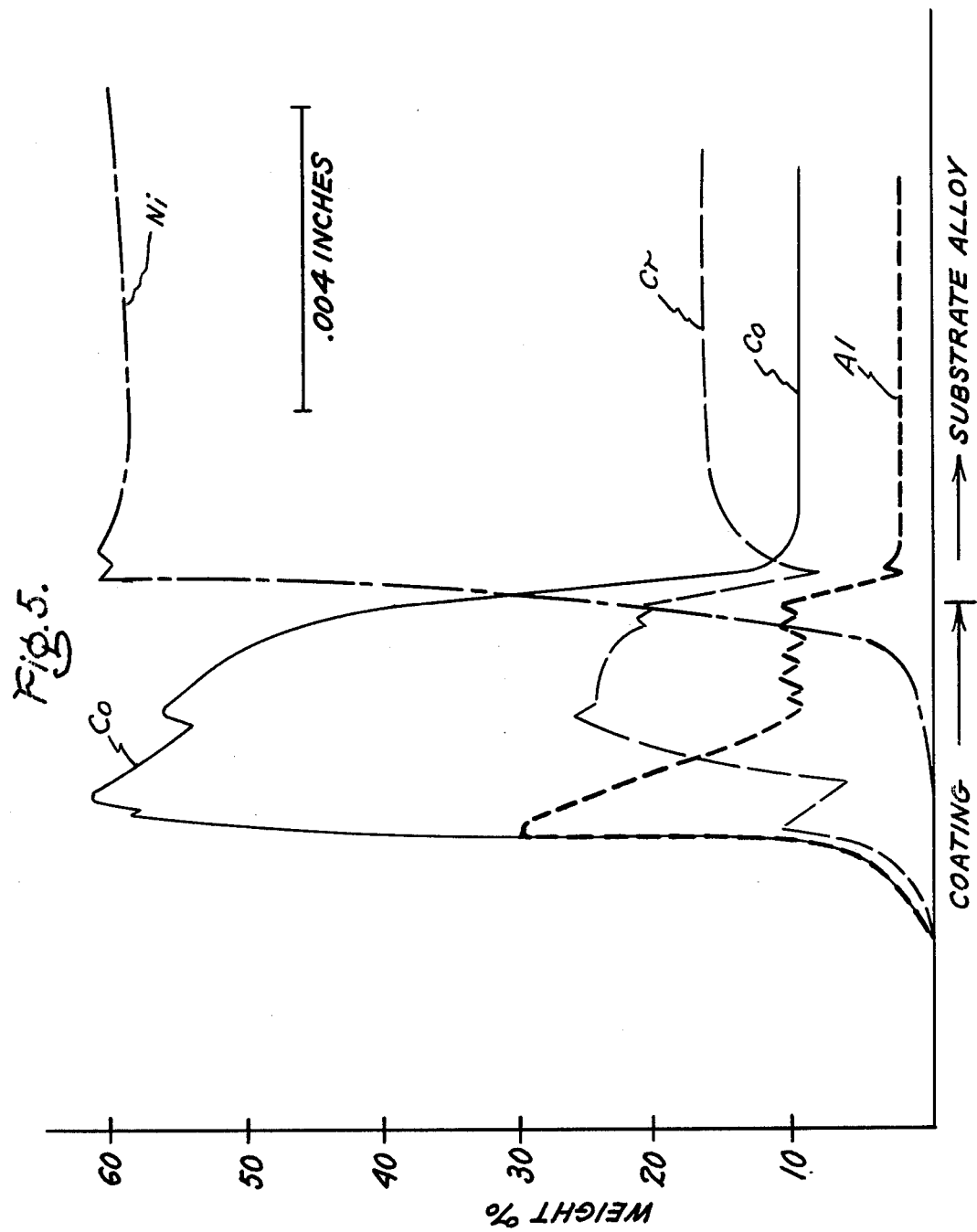
FIG. 5 is a microprobe profile of a body prepared by our invention and showing the high surface gradient of aluminum.

A photomicrograph of a nickel-base superalloy which has been coated with a first coating of a NiCrAlY alloy and then an aluminizing overcoating is shown in FIG. 2. The first coating exhibited grain boundaries that are oriented in a perpendicular direction to the deposition plane, which become sites for attack by high temperature oxidation and corrosion. Upon application of the aluminizing overcoat, any open defects of an MCrAlY coating become filled and a high concentration of aluminum is deposited on the outer surface of the coating as shown in FIG. 5 (a concentration profile of a CoCrAlY coated Rene 80 body with an aluminizing overcoating). It is to this unique coating system that we attribute the improved properties of high temperature oxidation and corrosion resistance.

Our invention is further illustrated by the following examples:

EXAMPLE I

Cast pins of Rene 80 nickel-base superalloy 3 in. long were ground to a diameter of 0.160 in. They were placed into a vacuum electron beam furnace and the chamber was then evacuated to $10^{-5}$ microns of mercury. The pins were rotated during deposition and a resistance heater was used to heat the pins. When the temperature reached 900° C., the electron beam was focused on an ingot having the following nominal composition:

| Ingredient | Weight % |
| --- | --- |
| Cobalt | 64 |
| Chromium | 22 |
| Aluminum | 13 |
| Yttrium | 1 |

Evaporation of the metal was at a constant power of 19.0 kilovolts and 275 milliamps for 30 minutes. The pins were then cooled in vacuum. A coating having a thickness of about 3 mils was deposited on the pins.

One group of coated pins was then lightly sand blasted to prepare the surface for vapor deposition. The aluminizing mixture was prepared by mixing 30 g. of +200–350 mesh NiAl$_3$ powder and 270 g. of alumina in a suitable container. Then 300 ml. of a 0.2% aqueous NH$_4$F solution was added and the contents heated to about 300° C., while mixing occasionally to remove the water by evaporation. The completely dry powder was put into an Inconel metal box (with 2 holes in the top of each end) in an amount of at least 3 g. of powder to each square centimeter of surface to be aluminized. The CoCrAlY coated samples were put in the box and completely covered by the powder. The box was then covered and placed in a retort that had approximately 0.5 cu. ft./hr. of hydrogen flowing through it and placed in a furnace. The furnace was heated to 850° C., held at that temperature for one hour and then cooled to room temperature. Upon examination of the sample it was noted that this procedure resulted in a penetration of about 1–2 mils of aluminum into the surface of the CoCrAlY coating.

A crucible test was then performed to test resistance to oxidation and corrosion of the samples coated only with the CoCrAlY coating and the second group subjected to a subsequent aluminizing procedure. Both groups of coated pins were immersed in a bath of Na$_2$SO$_4$-V$_2$O$_5$ (75%:25% by weight) at a temperature of 900° C., while gaseous oxygen was bubbled through the bath. After 18 hours the samples were removed.

It was observed that the samples coated only with the CoCrAlY coating were characterized by deep "spike" corrosion, but the pins subjected to the aluminizing overcoating procedure were substantially more resistant to attack by corrosion.

EXAMPLE II

Following the procedure of Example I, test pins having a diameter of one-eighth in. were prepared from Rene 80 nickel-base superalloy. The pins were coated by electron beam evaporation with the following nominal composition:

| Ingredient | Weight % |
|---|---|
| Cobalt | 64.5 |
| Chromium | 25 |
| Aluminum | 10 |
| Yttrium | 0.5 |

After the pins were removed from the apparatus, the coating had a thickness of 3–5 mils.

Thereafter the coated pins were aluminized by the pack cementation technique. A pack composition was prepared to meet the following specification in weight percent: 60% Ti, 33.5% Al, and 4.8–5.6% C. A one and a half percent by weight pack was prepared by diluting the pack in 98.5% by weight of $Al_2O_3$. The coated pins were then embedded in the powder mixture and aluminized at a temperature of 1925° F. for four hours.

Figure 3:
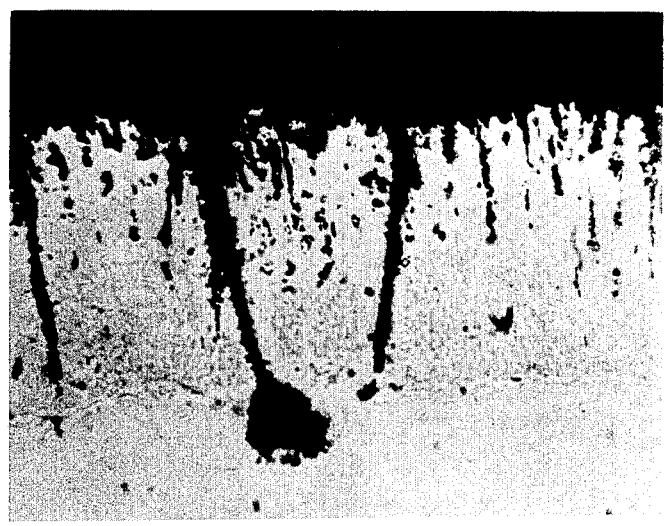
FIG. 3 is a photomicrograph (500×) illustrating the effect of corrosion on a CoCrAlY coated superalloy body.
Figure 4:
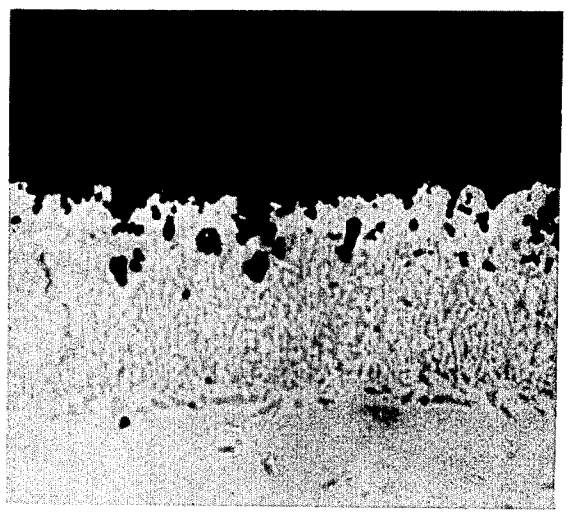
FIG. 4 is a photomicrograph (500×) illustrating the effect of corrosion on a superalloy body coated first with a CoCrAlY coating and then treated with an aluminizing overcoat.

Comparative high temperature oxidation and corrosion tests were performed on test samples coated only with the CoCrAlY alloy and on test samples which had been subsequently subjected to the aluminizing overcoat. In the crucible test, the pins were partially immersed in sodium sulfate and a mixture of 80 parts by weight of sodium sulfate and 20 parts by weight of vanadium pentoxide for a time of 16 hours. The samples coated only with the CoCrAlY coating after being subjected to a temperature of 1925° F. for one hour in vacuum are shown in FIG. 3. Typical "spike" corrosion and penetration were observed. The samples which had been protected by the aluminizing overcoat, after being subjected to a temperature of 1925° F. for four hours in vacuum are shown in FIG. 4. The results indicated almost a complete absence of "spike" corrosion and that the aluminized coating had filled in the defects of the initial coating.

Another group of samples was subjected to a burner rig test which simulated conditions used in a gas turbine engine. The test was run for 2000 hours at a temperature of 1475° F. using a jet fuel containing one ppm. sea salt and five ppm. of vanadium pentoxide. The results indicated that CoCrAlY coated samples were heavily attacked whereas the aluminized overcoated samples were still intact.

EXAMPLE III

Following the procedure of Example I, cast pins of Rene 80 nickel-base superalloy were coated by vapor deposition with the following nominal composition:

| Ingredient | Weight % |
|---|---|
| Nickel | 61.5 |
| Cobalt | 9.5 |
| Chromium | 25.0 |
| Aluminum | 3.0 |
| Ytrrium | 1.0 |

A coating having a thickness of about 3 mils was deposited on the pins. Some of the pins were then aluminized by the pack cementation technique described in Example I.

When subjected to the corrosion tests it was observed that the pins subjected to the aluminizing overcoat procedure were considerably more resistant to corrosion than those which had been coated only with the MCrAlY coating.

It will be appreciated that the invention is not limited to the specific details shown in the examples and illustrations and that various modifications may be made within the ordinary skill in the art without departing from the spirit and scope of the invention.

We claim:

1. A coated gas turbine engine component comprising a substrate selected from the group consisting of a nickel-base and a cobalt-base superalloy, and a coating system thereon comprising a first coating composition consisting essentially of chromium, aluminum, a member selected from the group consisting of yttrium and the rare earth elements, and an element selected from the group consisting of iron, cobalt and nickel, and an aluminizing overcoating to increase the oxidation and corrosion resistance of the substrate.

2. The component of claim 1, wherein the first coating has a thickness of about 3–5 mils and the aluminizing overcoating penetrates into the first coating to a depth of about 1–2 mils.

3. The component of claim 1, wherein said substrate is a nickel-base superalloy.

4. The component of claim 1, wherein said substrate is a cobalt-base superalloy.

* * * * *